US 8,077,493 B2

(12) United States Patent
Katayama

(10) Patent No.: US 8,077,493 B2
(45) Date of Patent: Dec. 13, 2011

(54) SEMICONDUCTOR MEMORY DEVICE

(75) Inventor: Akira Katayama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 12/635,552

(22) Filed: Dec. 10, 2009

(65) Prior Publication Data

US 2010/0142253 A1    Jun. 10, 2010

(30) Foreign Application Priority Data

Dec. 10, 2008    (JP) .................................. 2008-313920

(51) Int. Cl.
*G11C 5/06* (2006.01)
*G11C 8/08* (2006.01)
*G11C 7/00* (2006.01)

(52) U.S. Cl. .................. 365/72; 365/230.06; 365/210.1; 365/154; 365/203; 365/156

(58) Field of Classification Search .......... 365/72, 365/230.06, 210.1, 154, 203, 156
See application file for complete search history.

(56) References Cited

U.S. PATENT DOCUMENTS

| | | | | |
|---|---|---|---|---|
| 7,054,211 B2 * | 5/2006 | Tsujimura et al. | ............ | 365/204 |
| 7,193,904 B2 * | 3/2007 | Joshi | ........ | 365/189.08 |
| 7,376,032 B2 * | 5/2008 | Nguyen et al. | ............ | 365/210.1 |
| 7,570,525 B2 * | 8/2009 | Nii et al. | ................ | 365/189.11 |

OTHER PUBLICATIONS

Ohbayashi S. et al., A 65 nm SoC Embedded 6T-SRAM Design for Manufacturing with Read and Write Cell Stabilizing Circuits, IEEE 2006 Symposium on VLSI Circuits Digest of Technical Papers, in 2 pages.
Ishibashi, K. et al., A 1-V TFT-Load SRAM Using a Two-Step Word-Voltage Method, IEEE Journal of Solid-State Circuits, vol. 27, No. 11, Nov. 1992, pp. 1519-1524.

* cited by examiner

*Primary Examiner* — Hoai V Ho
*Assistant Examiner* — Tri Hoang
(74) *Attorney, Agent, or Firm* — Knobbe, Martens, Olson & Bear LLP

(57) ABSTRACT

A semiconductor memory device includes a memory cell array disposing a plurality of memory cells at each intersection of word lines and bit lines, the memory cell including one pair of cross-connected inverters including a transistor, a first dummy transistor having a threshold voltage which has a certain relationship with a threshold voltage of the transistor of the memory cell, a dummy bit line connected to one end of the first dummy transistor, and the dummy bit line charged so as to have a predetermined voltage, a dummy transistor control circuit configured to control conduction of the first dummy transistor, and a word line driver configured to supply a word line voltage to the word line connected to the selected memory cell, and the word line driver configured to change a rise time of the word line voltage in accordance with a change in a voltage of the dummy bit line.

18 Claims, 7 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2008-313920, filed Dec. 10, 2008, the entire contents of which are incorporated herein by reference.

BACKGROUND

1. Technological Field

The present invention relates to a semiconductor memory device, and more specifically to a static random access memory (SRAM) including a memory cell which is formed of cross-connected inverters.

2. Description of the Related Art

In recent years, with the higher integration and the lowering of a supply voltage in a semiconductor integrated circuit, an SRAM used in such an integrated circuit has suffered from a problem of an increase of its operational margin defect. In this regard, a disturb margin is an index indicating stability of an SRAM cell at a time when data is read therefrom. The disturb margin shows the capability of a memory cell to hold data without destroying the data when the data is read therefrom. The higher integration causes a variation in threshold voltage among memory cell transistors. Meanwhile, the lowering of a supply voltage causes a variation among the memory cells in timing when a transfer transistor is brought into conduction in response to a rise of the voltage of a word line. As a result, the data held in the memory cell is likely to be inversed and destroyed.

As a method for improving the disturb margin, there is known a method of raising a potential of a word line signal in two steps when reading data (see, for example, "A 1-V TFT-Load SRAM Using a Two-step Word-Voltage Method," K. Ishibashi, IEEE JOURNAL OF SOLID-STATE CIRCUITS, VOL 21, NO II, NOVEMBER 1992, hereinafter referred to as non-patent document 1). In addition, another method has been proposed, for example, in which the potential of a word line signal is controlled in accordance with a degree of a variation (global variation) in threshold voltage among memory cells in a memory cell array (see, for example, "A 65 nm SoC Embedded 6T-SRAM Design for Manufacturing with Read and Write Cell Stabilizing Circuits," S. Ohbayashi, VLSI Circuits Digest of Technical Papers. 2006, hereinafter referred to as non-patent document 2).

The method of non-patent document 1 requires two levels of supply voltages. Accordingly, two types of charge pump circuits have to be prepared. Thus, an increase in a circuit size is a problem.

On the other hand, the method of non-patent document 2 improves a disturb margin by setting the potential of the word line signal to be low when the variation is large. However, a write margin which indicates easiness of writing data is deteriorated. Accordingly, there is a problem that it is difficult to improve both the disturb margin and the write margin at the same time.

SUMMARY OF THE INVENTION

An exemplary embodiment described herein provides a semiconductor memory device including a memory cell array disposing a plurality of memory cells at each intersection of word lines and bit lines, the memory cell including one pair of cross-connected inverters including a transistor, a first dummy transistor having a threshold voltage which has a certain relationship with a threshold voltage of the transistor of the memory cell, a dummy bit line connected to one end of the first dummy transistor, and the dummy bit line charged so as to have a predetermined potential, a dummy transistor control circuit configured to control conduction of the first dummy transistor, and a word line driver configured to supply a word line voltage to the word line connected to the selected memory cell, and the word line driver configured to change a rising rate of the word line voltage in accordance with a change in a voltage of the dummy bit line.

Another exemplary embodiment described herein provides A method of controlling a semiconductor memory device including selecting a memory cell, driving a word line driver, charging a dummy bit line to a predetermined voltage based on an instruction from the word line driver, controlling a conduction of a dummy transistor having a threshold voltage which has a certain relationship with a threshold voltage of a transistor of the memory cell, changing a voltage of a dummy bit line according to the threshold voltage of the transistor of the memory cell, and changing a rising rate of a word line voltage in accordance with a change in a voltage of the dummy bit line.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
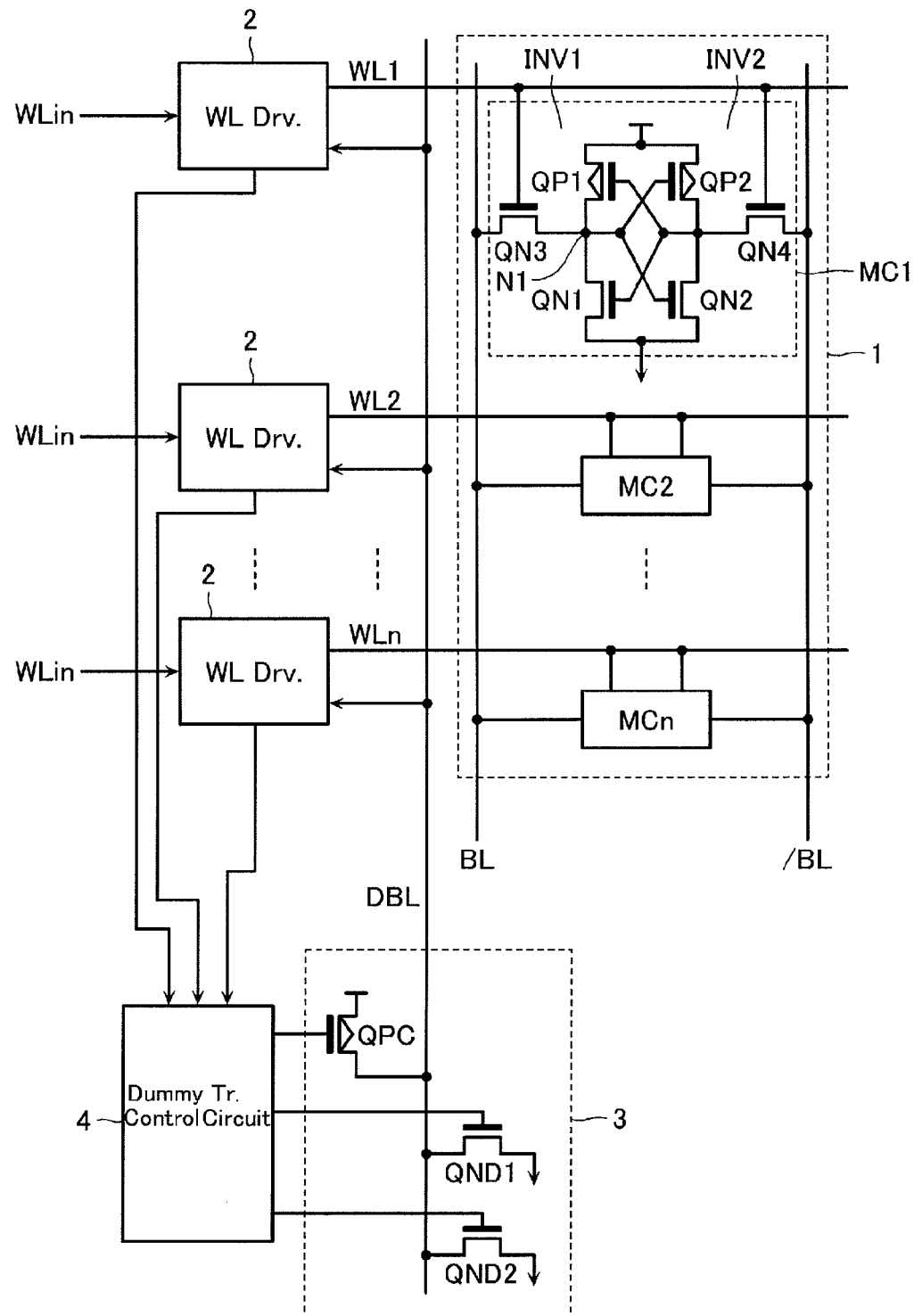
FIG. 1 is a circuit diagram showing the configuration of a nonvolatile semiconductor memory device according to a first embodiment of the present invention.

Various other objects, features and attendant advantages of the exemplary embodiments described herein will be more fully appreciated from the following detailed description when considered in connection with the accompanying drawings in which like reference characters designate like or corresponding parts throughout the several views.

Next, preferred embodiments of the present invention are described in detail by referring to the drawings.

First Embodiment

Firstly, a semiconductor memory device according to a first embodiment of the present invention is described by referring to FIG. 1.

(1) Configuration of First Embodiment

FIG. 1 is a schematic view showing the configuration of a semiconductor memory device according to the first embodiment. This semiconductor memory device mainly includes a memory cell array 1, word line drivers 2, a dummy cell array 3, and a dummy transistor control circuit 4. The semiconductor memory device additionally includes a sense amplifier to sense potentials of a bit line, a row decoder, a column decoder, and the like. However, the description thereof is omitted for simplification.

The memory array 1 is configured in such a manner that multiple memory cells MC each disposed at an intersection of a bit line pair BL and /BL and a word line WL. In the following, for simplification, the description is given of a case where only one pair of bit lines BL and /BL are shown and the memory cells MC1 to MCn are arranged along the pair of bit lines BL and /BL. Needless to say, the present invention is not intended to be limited to this.

The memory cell MC is formed by cross-connection (the structure in which one output terminal is connected to the other input terminal) of an inverter INV1 with an inverter INV2, the inverter INV1 having a pMOS transistor QP1 and an nMOS transistor QN1 which are connected in series and the inverter INV2 having a pMOS transistor QP2 and an nMOS transistor QN2 which are connected in series.

In addition, the memory cell MC has a transfer transistor QN3 which is connected between a node N1 and the bit line B and a transfer transistor QN4 which is connected between a node N2 and the bit line /BL. If a memory cell MC is selected, a voltage of the word line WL to be connected to the memory cell MC is raised. Thereby, the transfer transistors QN3 and QN4 are conducted. Accordingly, signals of the nodes N1 and N2 are read out toward the bit lines BL and /BL. After that, the signals are amplified by an unillustrated sense amplifier to be output to the outside.

The word line driver 2 is a circuit for driving the word line WL which is connected to the selected memory cell MC according to selection signals WLin which are supplied via an unillustrated address decoder or row decoder. This word line driver 2 is configured, as described later, in such a manner as to be capable of changing a rising rate (slew rate) of the voltage of the word line WL in accordance with threshold voltages of transistors, particularly, nMOS transistors QN1 to QN4, which constitute the memory cell MC. More specifically, the word line driver 2 is configured so that the slew rate of the word line WL would be changed in accordance with the change in the potential of a dummy bit line DBL.

The dummy cell array 3 is configured by connecting, in parallel, multiple (here, two) dummy transistors QND1 and QND2 between the dummy bit line DBL and a ground terminal.

The dummy transistors QND 1 and QND2 are transistors, each of which is given a threshold voltage having a certain relationship with transistors (particularly, the transistors QN1 to QN4) constituting the memory cell MC. For example, the dummy transistors QND1 and QND2 are formed so as to have a gate width and a gate length, which are the same as those of the transistors QN1 and QN2, and have a condition for impurity implantation or the like, which is the same as that for impurity implantation performed in the transistors QN1 and QN2. Thereby, the threshold voltages of both the dummy transistors QND1 and QND2 and the transistors QN1 and QN2 can be made substantially equal.

The dummy transistors QND1 and QND2 are connected in parallel between the dummy bit line DBL and the ground terminal. Gate voltages thereof are controlled by the dummy transistor control circuit 4. Note that a pMOS transistor QPC is provided as the configuration to charge, in advance, the dummy bit line DBL to a predetermined voltage. This pMOS transistor QPC is conducted according to signals from the dummy transistor control circuit 4 so as to charge the dummy bit line DBL to a predetermined potential.

(2) Operation of First Embodiment

Figure 2:
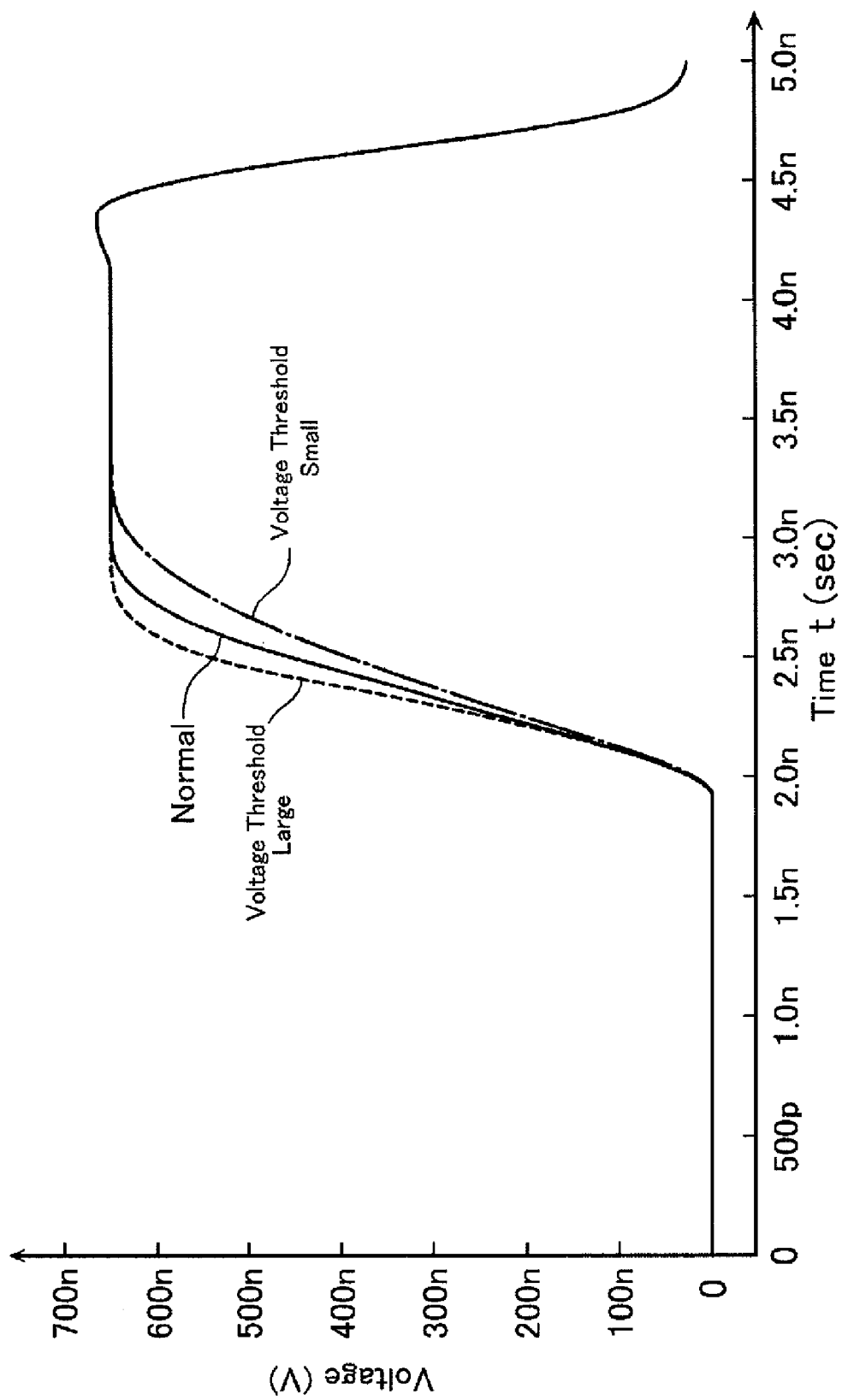
FIG. 2 is a graph showing the operation of the first embodiment of the present invention.

Next, the operation of the semiconductor memory device according to the first embodiment is described by referring FIGS. 1 and 2.

Threshold voltages of the pMOS transistor and the nMOS transistor, which constitute the memory cell MC, may vary among the memory cells MC because of variations in manufacturing processes thereof. When the different memory cells, even having a variation in threshold voltage thereamong, are supplied with a word line voltage at a single rising rate (slew rate), a writing error is likely to occur in a memory cell having a lower threshold voltage.

For this reason, in the present embodiment, as shown in FIG. 2, the threshold voltages of the transistors constituting the memory cell MC are determined by a method to be described later, so that the rising rate of the voltage of the word line WL is changed in accordance with a degree of the threshold voltage. If the threshold voltage is smaller than a reference value (in a normal case, a graph shown by the solid line), the rising rate of the voltage of the word line WL is set to be slower (a graph shown by the dashed-line in FIG. 2). In contrast, if the threshold voltage is larger than a reference value, the rising rate of the voltage of the word line WL is set to be faster (a graph shown by the dotted-line in FIG. 2).

It is determined based on a magnitude of the voltage of the dummy bit line DBL whether the threshold voltage of the transistor constituting the memory cell is large or small. Drains of the dummy transistors QND1 and QND2 are connected to the dummy bit line DBL.

If a certain memory cell MC is selected and the word line driver 2 starts driving, the dummy transistor circuit 4 also starts an operation according to a driving signal from the word line driver 2. Based on an instruction from the word line driver 2, the dummy transistor control circuit 4 causes the transistor QPC to be conducted so as to start charging the dummy bit line DBL, and causes the dummy transistors QND 1 and QND2 in the dummy cell array 3 to be conducted.

If the threshold voltages of the transistors QN1 to QN4 constituting the memory cell MC are larger than reference values, the dummy transistors QND1 and QND2 having substantially the same threshold voltage are not conducted. Accordingly, the dummy bit line DBL does not discharge to maintain a high potential. In this case, the word line driver 2 supplies the word line WL with a word line signal having a large rising rate (having larger inclination in the graph) as shown by the dotted line in FIG. 2.

In contrast, if the threshold voltages of the transistors QN1 to QN4 constituting the memory cell MC are smaller than reference values, the dummy transistors QND1 and QND2 are conducted. Accordingly, the dummy bit line DBL discharges. In this case, the word line driver 2 detects a potential of the dummy bit line DBL and supplies the word line WL with a word line signal having a small rising rate as shown by the dashed line in FIG. 2.

As described above, according to the present embodiment, the magnitude of the threshold voltages of the transistors QN1 to QN4 constituting the memory cell MC is detected based on the potential of the dummy bit line DBL. After that, based on the detection result, the word line driver 2 controls the rising rate of the voltage of the word line WL.

If the threshold voltages of the transistors QN1 to QN4 constituting the memory cell MC are small, the rising rate of the voltage of the word line WL is made smaller. Thereby, the timing of the transfer transistors QN3 and QN4 to be conducted can be delayed. As a result, a write disturbance due to the small threshold voltage is prevented from occurring.

In contrast, if the threshold voltages are large, the rising rate of the voltage of the word line WL is made larger. Thereby, the timing of the transfer transistors QN3 and QN4 to be conducted can be advanced. If the threshold voltages are large, there is a small probability of generating a write disturbance even if the timing of the transfer transistors QN3 and QN4 to be conducted is advanced. If there is no probability of a write disturbance as described above, a write margin can be improved by advancing the timing of the transfer transistors QN3 and QN4 to be conducted.

As described above, according to the present embodiment, both the write margin and the disturb margin can be improved by optimizing the rising rate of the word line WL.

Second Embodiment

Figure 3:
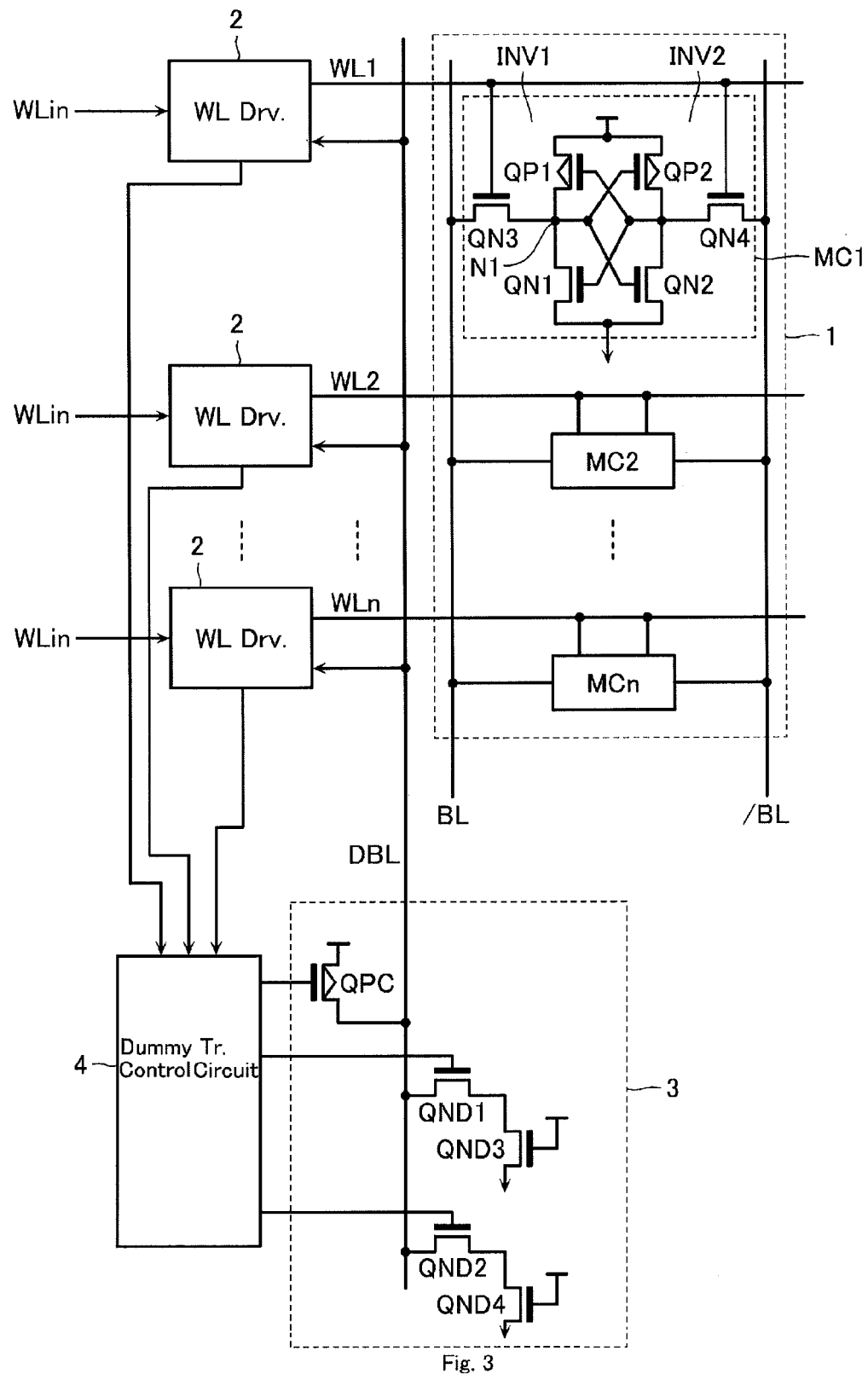
FIG. 3 is a circuit diagram showing the configuration of a nonvolatile semiconductor memory device according to a second embodiment of the present invention.

Next, a semiconductor memory device according to a second embodiment of the present invention is described by referring to FIG. 3. In FIG. 3, the same reference numerals are given to denote the same components as those of the first embodiment, and the detailed description thereof is omitted.

The second embodiment is different from the first embodiment in the configuration of a dummy transistor which is arranged in a dummy cell array 3. In other words, this dummy cell array 3 is different from that described in the first embodiment in that sources of dummy transistors QN1 and QN2 are not directly grounded but are connected to ground terminals via nMOS transistors QN3 and QN4. Gates of the nMOS transistors QN3 and QN4 are supplied with a supply voltage so as to be always held in a conductive state. Other points are similar to those of the first embodiment, and thus the duplicated description is omitted. The present embodiment can attain effects similar to those of the first embodiment.

Third Embodiment

Figure 4:
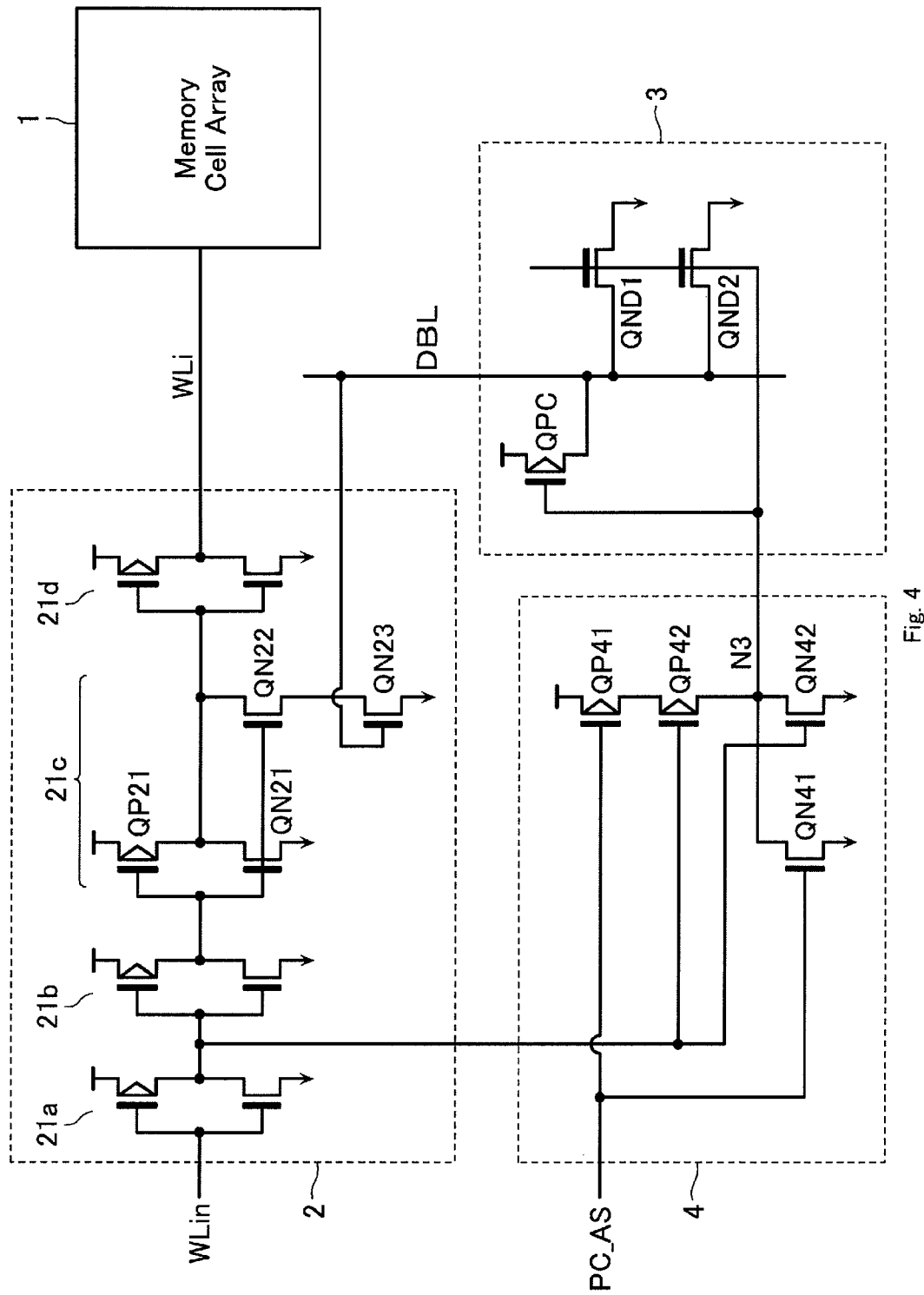
FIG. 4 is a circuit diagram showing the configuration of a nonvolatile semiconductor memory device according to a third embodiment of the present invention.

Next, a third embodiment of the present invention is described by referring to FIG. 4. In FIG. 4, the same reference numerals are given to denote the same components as those of the first embodiment, and the detailed description thereof is omitted.

A semiconductor memory device according to the present embodiment has configurations of a memory cell array 1 and a dummy cell array 3, which are substantially similar to those of the first embodiment. However, the semiconductor memory device according to the present embodiment is characteristic in that a dummy transistor control circuit 4 and a word line driver 2 have configurations as shown in FIG. 3.

The word line driver 2 includes an inverter chain circuit in which multiple inverters 21 (here, four inverters 21*a* to 21*d*) are connected in series. Among these inverters 21*a* to 21*d*, each of the inverters 21*a*, 21*b*, and 21*d* has a general configuration in which one pMOS transistor and one nMOS transistor are connected in series and gates thereof are commonly connected. In contrast, the inverter 21*c*—that is, an inverter in one stage before the last stage of the inverter chain circuit— has the configuration in which one pMOS transistor and two parallel-connected nMOS transistors QN21 and QN22 are connected in series.

The source of the nMOS transistor QN21 is directly connected to a ground terminal, whereas the source of the nMOS transistor QN22 is connected to the drain of another nMOS transistor QN23. The source of the nMOS transistor QN23 is connected to the ground terminal and the gate thereof is connected to a dummy bit line DBL.

In addition, the dummy transistor control circuit 4 includes pMOS transistors QP41 and QP42 and nMOS transistors QN41 and QN42. The pMOS transistors QP41 and QP42 are connected in series between a supply voltage terminal and a node N3. This node N3 is connected to transistors QPC and QND1 and the gate of the transistor QND2, which are in the dummy cell array 3. In addition, nMOS transistors QN41 and QN42 are connected in parallel between the node N3 and the ground terminal.

A control signal PC_AS is input from the outside to the gates of the pMOS transistor QP41 and the nMOS transistor QN41. The control signal PC_AS is expressed by "H" if the supply voltage is set higher than a reference value, whereas it is expressed by "L" if the supply voltage is set lower than the reference value. An output signal of the inverter 21*a* in the first stage of the word line driver 2 is supplied to the gates of the pMOS transistor QP42 and the nMOS transistor QN42.

If the control signal PC_AC is "H" because the supply voltage is higher than the reference value, the pMOS transistor QP41 is not conducted, and, in contrast, the nMOS transistor QN41 is conducted. As a result, a potential of the node 3 becomes 0V. Accordingly, the dummy transistors QND1 and QND2 are not conducted, so that the dummy bit line DBL remains in a high potential. For this reason, the word line driver 2 also has a uniform rising rate of the voltage of the word line WL regardless of a threshold voltage of a transistor constituting the memory cell MC.

On the other hand, if the control signal PC_AS is "L" because the supply voltage is lower than the reference value, the pMOS transistors QP41 and QP42 are conducted, and, in contrast, the nMOS transistors QN41 and QN42 are not conducted. As a result, the potential of the node N3 is charged to a supply voltage VDD. Accordingly, the dummy transistors QND1 and QND2 are conducted, and the dummy bit line DBL is discharged so as to have a low potential in accordance with the threshold voltage thereof. For this reason, the word line driver 2 also changes a rising rate of the voltage of the word line WL, in accordance with a threshold voltage of a transistor constituting the memory cell MC.

As described above, the present invention is different from the first embodiment in that the operation of the word line driver 2 changes in accordance with the magnitude of the supply voltage and, if the supply voltage is large, the rising rate of the voltage of the word line WL is not controlled. If the supply voltage is higher than the reference value, there is a small possibility that a write disturbance occurs. Accordingly, there is no need to control the rising rate of the voltage of the word line WL.

Next, the operation of a non-volatile semiconductor device according to the third embodiment is described. If the control signal PC_AS is "L", the dummy transistors QND1 and QND2 are conducted, so that the potential of the dummy bit line DBL is decreased in accordance with the threshold voltage thereof (that is, in accordance with the threshold voltage of the transistor constituting the memory cell MC). In this case, the nMOS transistor 23 constituting the inverter 21*c* in the word line driver 2 is switched, from the state in which the nMOS transistor is conducted, to the state in which the nMOS transistor is not conducted. Accordingly, the driving force of the inverter 21*c* is decreased. With the decrease of the driving force of the inverter 21*c*, the rising rate of the voltage of the word line WL is decreased. If the threshold voltage is high, the potential of the dummy bit line DBL is not decreased. Accordingly, the rising rate of the word line WL is set to be higher. In the present embodiment, adjustment of the rising rate of the word line WL is performed by changing the driving force of the inverter 21c.

In FIG. 4, the inverter 21c is an inverter located one stage before the last stage of the inverter chain circuit. However, the present invention is not limited to this. In the present invention, an inverter located at an earlier stage than the above may be configured as the inverter 21c. In addition, the number of the parallel-connected nMOS transistors in the inverter 21c is not limited to two, but may be three or more. Also, the number of the nMOS transistors to be switched to be a non-conductive state in such a case is not limited to one, but may be two or more. Furthermore, the method for causing the nMOS transistor QN22 to be non-conductive is not limited to the one shown in FIG. 4. For example, the nMOS transistor QN23 may be connected between the output terminal of the inverter 21c and the nMOS transistor QN23.

Fourth Embodiment

Figure 5:
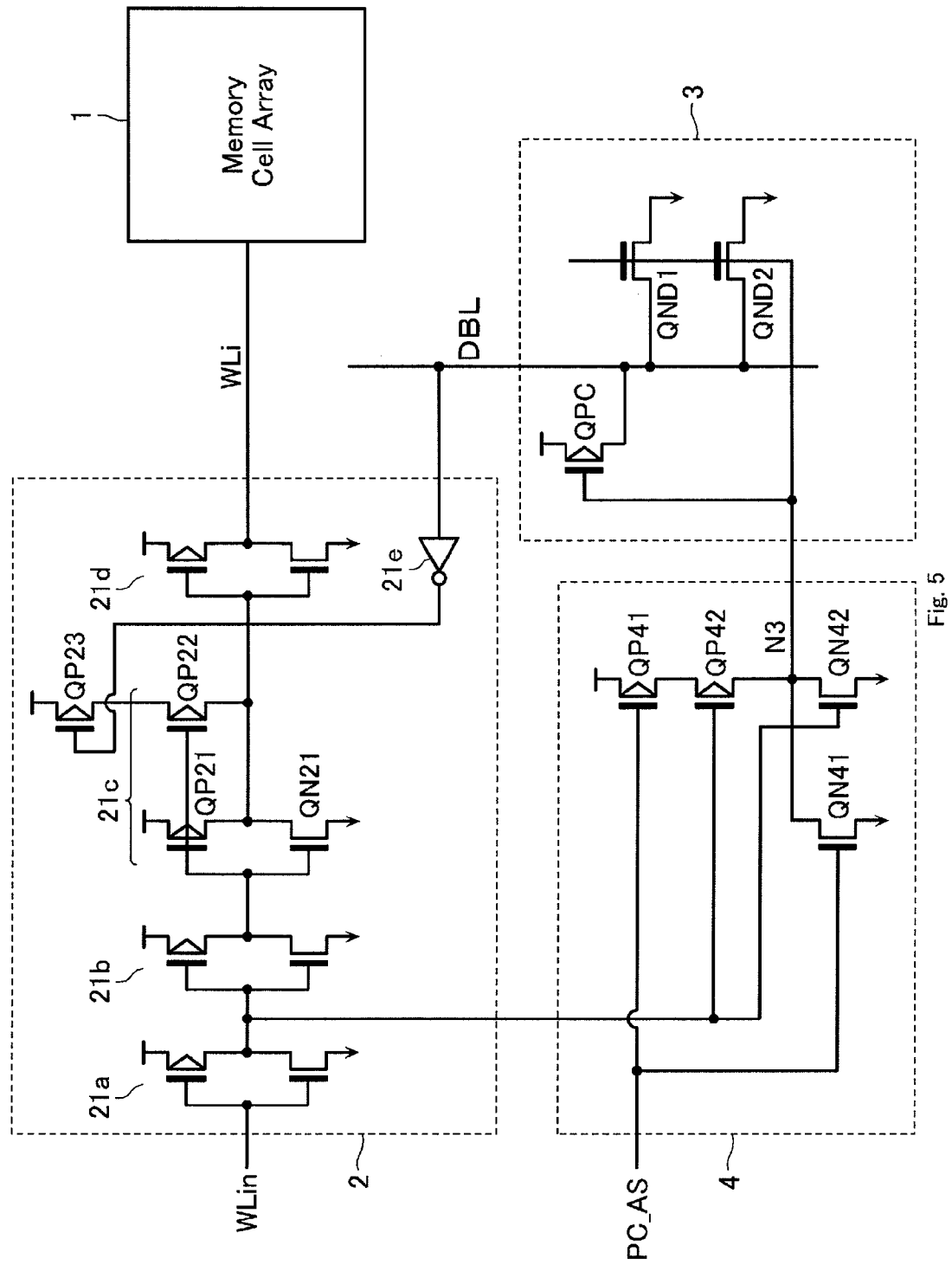
FIG. 5 is a circuit diagram showing the configuration of a nonvolatile semiconductor memory device according to a fourth embodiment of the present invention.

Next, a fourth embodiment of the present invention is described by referring to FIG. 5. This fourth embodiment is the same as the third embodiment, except the difference to be described below. In FIG. 5, the same reference numerals are given to denote the same components as those of the first embodiment and the detailed description thereof is omitted.

The present embodiment is different from the third embodiment in that an inverter 21c whose driving force is changeable includes a pMOS transistor QP22 instead of an nMOS transistor QN22. The pMOS transistor QP22 is connected to the gate which is commonly connected to the pMOS transistor QP21. The source of the pMOS transistor QP22 is connected to the drain of the pMOS transistor QP21 and the source thereof is connected to another pMOS transistor QP23. The source of the pMOS transistor QP23 is connected to the supply voltage and the gate thereof is connected to the dummy bit line DBL via an inverter 21e.

In the present embodiment, if threshold voltages of the dummy transistors QND1 and QND2 are low, the pMOS transistor QP23 is made non-conductive. Thereby, the driving force of the inverter 21c is decreased and a rising rate of the voltage of the word line WL is decreased. In other words, effects similar to those of the third embodiment are attainable.

It should be noted that the pMOS transistor QP23 can be replaced with an nMOS transistor. In this case, the inverter 21e is not needed and the gate of the nMOS transistor can be directly connected to the dummy bit line DBL.

In addition, the present invention is similar to the third embodiment in that the inverter 21c is not limited to an inverter located one stage before the last stage of an inverter chain circuit and the number of the parallel-connected nMOS transistors in the inverter 21c is not limited to two, but may be three or more.

Fifth Embodiment

Figure 6:
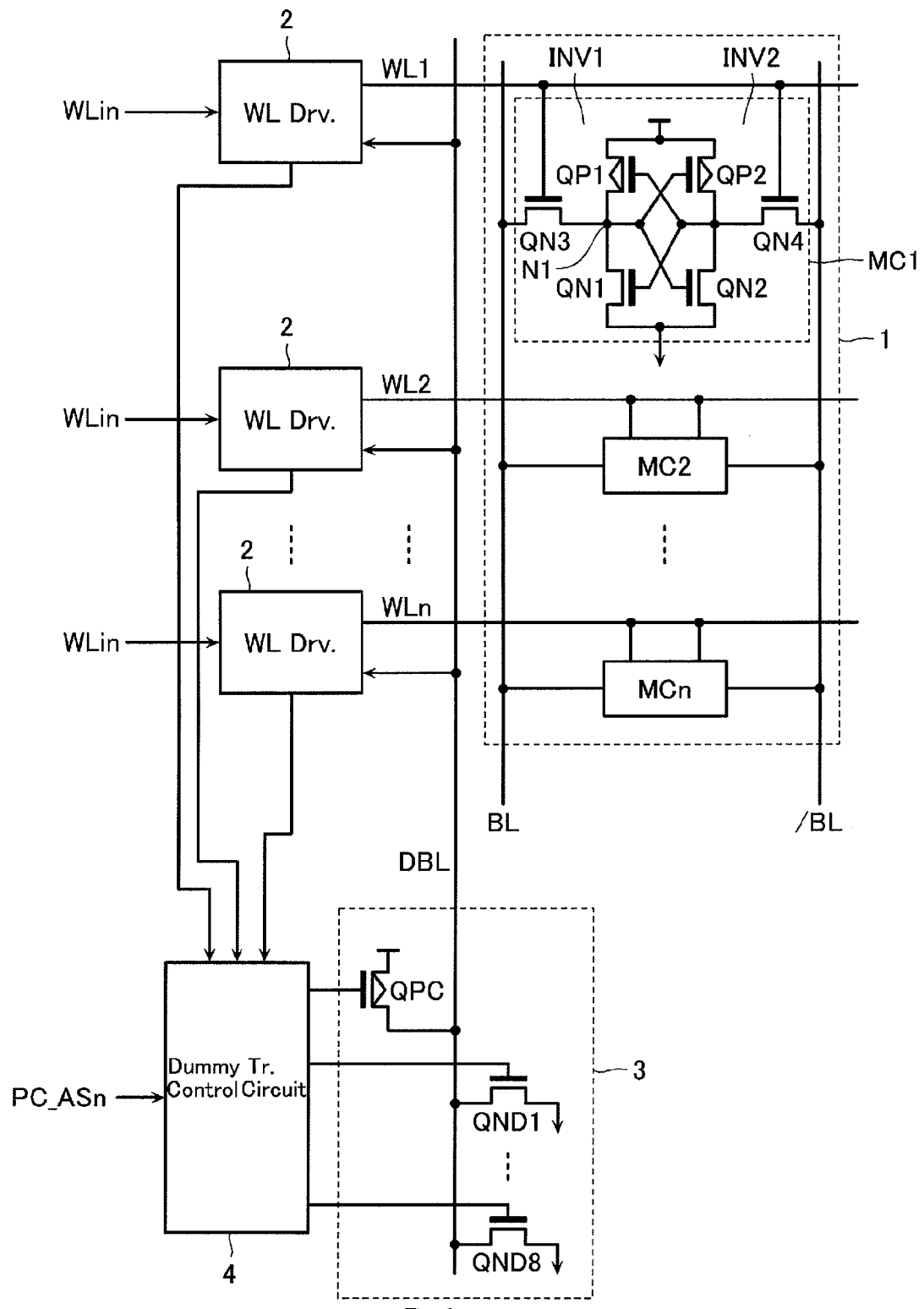
FIG. 6 is a circuit diagram showing the configuration of a nonvolatile semiconductor memory device according to a fifth embodiment of the present invention.

Next, a semiconductor memory device according to a fifth embodiment of the present invention is described by referring to FIG. 6. In FIG. 6, the same reference numerals are given to denote the same components as those of the first embodiment (FIG. 1), and the detailed description thereof is omitted.

As shown in FIG. 6, the present embodiment is different from the first embodiment in that a dummy cell array 3 includes a large number of dummy transistors QNDi (here, i=1 to 8), and, moreover, the number of the dummy transistors QNDi to be conducted at the same time is changeable based on a control signal PC_ASn.

Figure 7:
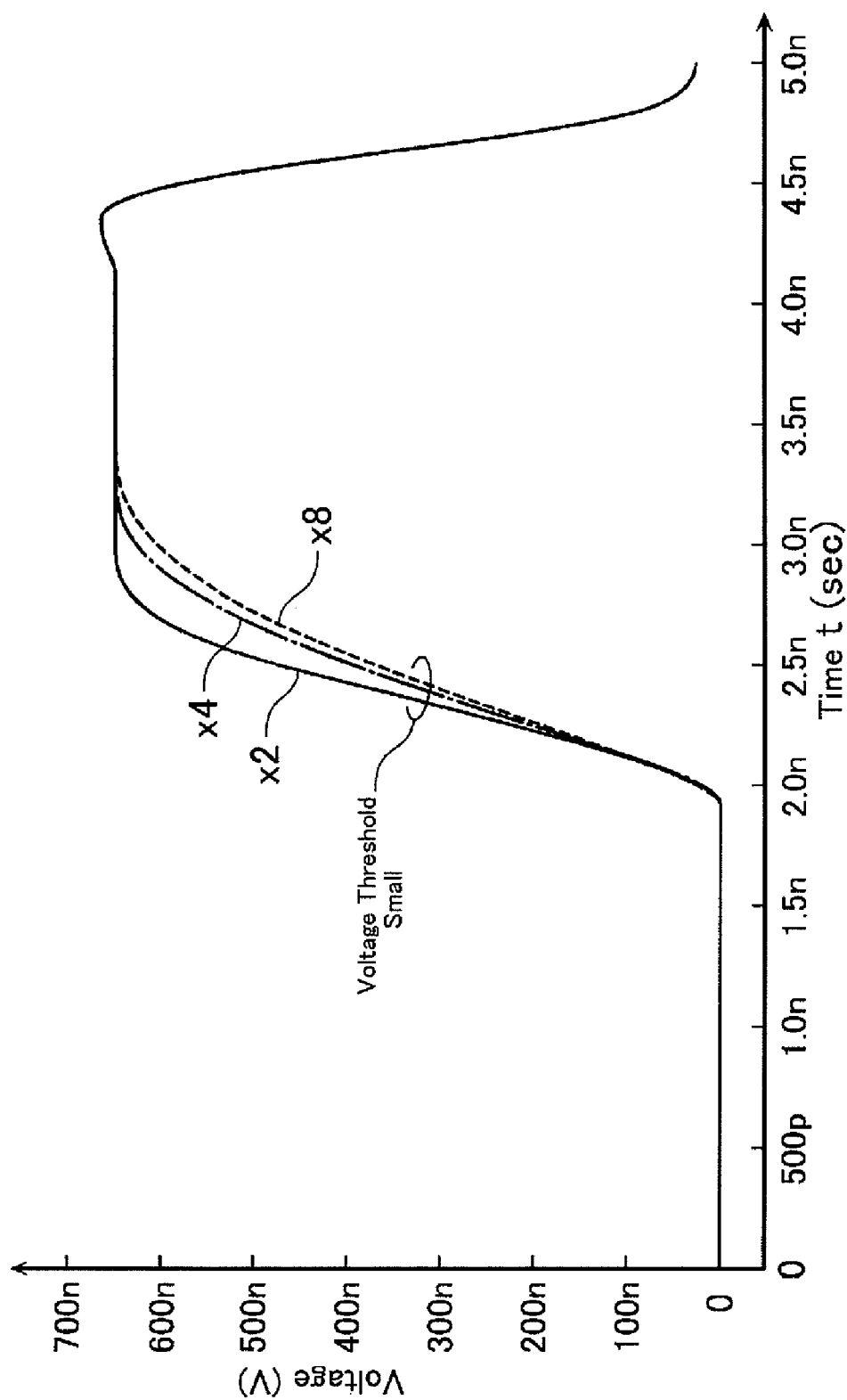
FIG. 7 is a graph showing the operation of the fifth embodiment of the present invention.

If the number of the dummy transistors QNDi to be conducted at the same time is unchangeable, the operation to be performed is similar to that of the first embodiment (see, FIG. 2). However, if the number of the dummy transistors QNDi to be operated at the same time is changed to, for example, two, four, or eight according to the control signal PC_ASn, then a rising rate of a word line WL is also changed as shown in FIG. 7 even if a threshold voltage is not changed. In this manner, adjustment of the rising rate of the word line WL can further improve both the disturb margin and the write margin at the same time.

As described above, the preferred embodiments of the present invention are described. However, the present invention is not limited to these embodiments. Various modifications, additions, and the like are possible without departing from the scope of the present invention. For example, in the above-described embodiments, the description has been given of an example in which one memory cell MC includes six transistors as shown in FIG. 1. However, needless to say, the present invention is not limited to this example.

In addition, the word line driver 2 is not limited to the circuit specifically shown in FIG. 4, but is only needed to have a rising rate of the word line WL which is adjustable according to the degree of the decrease of the potential of the dummy bit line DBL. For example, a delay element for increasing a time constant according to the decrease of the potential of the dummy bit line DBL may be included so as to control the rising rate of the word line WL. Alternatively, a circuit may be configured to increase the number of stages of the inverter chain circuit according to the decrease of the potential of the dummy bit line DBL.

Furthermore, with regards to the dummy cell array 3, a common dummy cell is used for the multiple memory cells MC along the pair of bit lines BL and /BL in the above-described embodiments. However, one dummy cell may be provided for each memory cell, for example.

While the exemplary embodiments may be subject to various modifications and expressed in alternative forms, the embodiments discussed herein are non-limiting examples. It should be understood that the drawings and detailed description are not intended to limit the invention to the particular embodiments which are described. This disclosure is instead intended to cover all modifications, equivalents and alternatives falling within the scope of the present invention as defined by the appended claims.

The invention claimed is:

1. A semiconductor memory device comprising:
   a memory cell array comprising a plurality of memory cells at intersections of word lines and bit lines, the memory cell comprising one pair of cross-connected inverters comprising transistors;
   a first dummy transistor comprising a threshold voltage comprising a predetermined relationship with a threshold voltage of the transistor of the memory cell;
   a dummy bit line connected to a first end of the first dummy transistor, the dummy bit line being configured to be charged to a predetermined voltage;
   a dummy transistor controller configured to control conduction of the first dummy transistor; and
   a word line driver configured to supply a word line voltage to the word line connected to a selected memory cell, and the word line driver configured to change a first rise time of the word line voltage in accordance with a change in a voltage of the dummy bit line.

2. The semiconductor memory device of claim 1, wherein:
the word line driver comprises a plurality of inverters connected in serial, and the word line is configured to change driving force of one of the plurality of inverters in accordance with the change in the voltage of the dummy bit line.

3. The semiconductor memory device of claim 2, wherein:
one of the plurality of inverters comprises a first conductivity type transistor, a plurality of second conductivity type transistors are connected in parallel, and a first transistor is connected to at least one of the second conductivity type transistors,
the first conductivity type transistor is serially connected to the second conductivity type transistors,
the gates of the first and second conductivity type transistors are commonly connected, and
the first transistor is configured to switch to a non-conductive state in accordance with the change in the voltage of the dummy bit line.

4. The semiconductor memory device of claim 3, wherein:
the first conductivity type transistor is a n-type transistor, and
the second conductivity type transistor and the first transistor are p-type transistors.

5. The semiconductor memory device of claim 3, wherein:
the first conductivity type transistor is a p-type transistor, and
the second conductivity type transistor and the first transistor are n-type transistors.

6. The semiconductor memory device of claim 1, wherein:
a plurality of the first dummy transistors are connected in parallel between the dummy bit line and a ground terminal.

7. The semiconductor memory device of claim 6, wherein:
the dummy transistor controller is configured to change the number of the first dummy transistors conducted based on a number control signal.

8. The semiconductor memory device of claim 6, further comprising:
a second dummy transistor connected between the first dummy transistor and the ground terminal, comprising a gate connected to a power supply.

9. The semiconductor memory device of claim 1, wherein:
the dummy transistor controller is configured to operate the first dummy transistor when a supply voltage for operation decreases to a predetermined value or lower.

10. The semiconductor memory device of claim 1, wherein:
the threshold voltage of the transistor of the memory cell is substantially same with that of the first dummy transistor.

11. The semiconductor memory device of claim 1, further comprising:
a p-type transistor connected to the dummy bit line, and configured to charge the dummy bit line to a predetermined voltage.

12. The semiconductor memory device of claim 1, wherein:
the word line driver is configured to supply the word line voltage of a second rise time shorter than the first rise time to the word line when the dummy bit line comprises a substantially high voltage, and
the word line driver is configured to supply the word line voltage of a third rise time longer than the first rise time to the word line when the dummy bit line comprises a substantially low voltage.

13. The semiconductor memory device of claim 12, wherein:
the dummy bit line is configured to be discharged by the first dummy transistor when the threshold voltage of the transistor of the memory cell is smaller than a reference value.

14. A method of controlling a semiconductor memory device comprising:
selecting a memory cell;
driving a word line driver;
charging a dummy bit line to a predetermined voltage based on an instruction from the word line driver;
controlling a conduction of a dummy transistor comprising a threshold voltage comprising a predetermined relationship with a threshold voltage of transistors of the memory cell;
changing a voltage of a dummy bit line according to the threshold voltage of the transistors of the memory cell; and
changing a rise time of a word line voltage in accordance with a change in a voltage of the dummy bit line.

15. The method of claim 14, wherein:
the changing the rise time of the word line comprises:
supplying the word line voltage of a substantially short rise time to the word line when the dummy bit line comprises a substantially high voltage, and
supplying the word line voltage of a substantially long rise time to the word line when the dummy bit line comprises a substantially low voltage.

16. The method of claim 15, wherein:
the changing the voltage of the dummy bit line comprises:
discharging the dummy bit line by a dummy transistor when the threshold voltage of the transistor of the memory cell is smaller than a reference value.

17. The method of claim 14, wherein:
the controlling the conduction of the dummy transistor comprises
controlling the first dummy transistor when a supply voltage for operation decreases to a predetermined value or lower.

18. The method of claim 14, wherein:
the controlling the conduction of the dummy transistor comprises
changing the number of the first dummy transistors conducted based on a number control signal.

* * * * *